United States Patent [19]
Dettmann et al.

[11] Patent Number: 5,521,501
[45] Date of Patent: May 28, 1996

[54] MAGNETIC FIELD SENSOR CONSTRUCTED FROM A REMAGNETIZATION LINE AND ONE MAGNETORESISTIVE RESISTOR OR A PLURALITY OF MAGNETORESISTIVE RESISTORS

[75] Inventors: Fritz Dettmann, Sinn-Edingen; Uwe Loreit, Wetzlar, both of Germany

[73] Assignee: Institut fuer Mikrostrukturtechnologie und Optoelektronik e.V., Wetzlar, Germany

[21] Appl. No.: 374,795

[22] PCT Filed: May 31, 1994

[86] PCT No.: PCT/EP94/01789

§ 371 Date: Jan. 31, 1995

§ 102(e) Date: Jan. 31, 1995

[87] PCT Pub. No.: WO94/29740

PCT Pub. Date: Dec. 22, 1994

[30] Foreign Application Priority Data

Jun. 9, 1993 [DE] Germany ............ 43 19 146.0

[51] Int. Cl.⁶ .......................... G01R 33/02; G01B 7/14; H01L 43/02
[52] U.S. Cl. .................. 324/252; 324/207.12; 338/32 R
[58] Field of Search .......... 324/207.21, 207.12, 324/207.25, 207.24, 252, 173, 244, 251, 207.2; 338/32 R, 32 H

[56] References Cited

U.S. PATENT DOCUMENTS

| | | | |
|---|---|---|---|
| 4,847,584 | 7/1989 | Pant | 324/252 |
| 4,851,771 | 7/1989 | Ikeda et al. | 324/207.21 |
| 4,896,235 | 1/1990 | Takino et al. | 324/252 |
| 5,055,786 | 10/1991 | Wakatsuki et al. | 324/207.21 |
| 5,247,278 | 9/1993 | Pant et al. | 324/252 |
| 5,351,005 | 9/1994 | Rouse et al. | 324/207.21 |

FOREIGN PATENT DOCUMENTS

| | | |
|---|---|---|
| 3442278 | 5/1986 | Germany . |
| 4121374 | 1/1993 | Germany . |
| 59-214784 | 12/1984 | Japan . |
| 3223685 | 10/1991 | Japan . |
| 2202635 | 9/1988 | United Kingdom . |

OTHER PUBLICATIONS

Ueda et al.: "AC Bias Type Magnetoresistive Sensor". In: IEEE Transactions on Magnetics, vol. 26, No. 5, Sep. 5, 1990, New York, NY, pp. 1572–1574.
Technical Information 901 228 of Philips Components Dec. 28, 1990.

*Primary Examiner*—Sandra L. O'Shea
*Assistant Examiner*—Roger Phillips
*Attorney, Agent, or Firm*—Spencer & Frank

[57] ABSTRACT

Described is a sensor based on the magnetoresistive effect and integrated into the thin-film arrangement of a remagnetization line in the form of a meander. In an adaptation to this meandering structure, the magnetoresistive film strips are provided in regions with alternating positive- and negative-inclined Barber pole structures. When periodic remagnetization of the regions takes place, a drift-free AC voltage is obtained as a sensor output signal. This lack of drift is the presupposition for the use of the magnetic field sensor for precise measurement of weak magnetic fields.

6 Claims, 2 Drawing Sheets

5,521,501

MAGNETIC FIELD SENSOR CONSTRUCTED FROM A REMAGNETIZATION LINE AND ONE MAGNETORESISTIVE RESISTOR OR A PLURALITY OF MAGNETORESISTIVE RESISTORS

BACKGROUND OF THE INVENTION

As is generally known, the measurement of magnetic fields of a low intensity such as, for example, the earth's magnetic field, is possible with sensors utilizing an anisotropic magnetoresistive effect. But when large temperature changes occur, considerable problems arise because of a quite significant zero drift, in spite of a sufficient magnetic field sensitivity.

One method for the eliminating zero drift for magnetoresistive sensor bridges is described in the Technical Information 901 228 of Philips Components. The magnetoresistive sensor bridge is placed in a wound coil. Short current pulses of alternating direction through the coil generate a sufficient magnetic field to set the self-magnetization of the magnetoresistive film strips in the corresponding direction. Since the sensor signal changes its polarity with the reversal of the magnetization direction, the drift of the sensor bridge is also eliminated when the magnetic-field-proportional alternating component is separated from the steady component, which contains the zero voltage of the sensor bridge. But the production of such coils is expensive. Their inductance limits the measuring frequency. Adjusting the sensor elements in the coil is an expensive step, in particular when all three magnetic field components in the space are to be measured with an arrangement.

SUMMARY OF THE INVENTION

It is an object of the invention to provide a magnetic field sensor having minimal zero drift, which can be cost-effectively produced entirely in thin-film technique, and in which limitations in the measuring frequency are not caused by the sensor element.

The above and other objects are accomplished according to the invention, in its simplest case by the provision of a single magnetic-field-dependent resistor comprising one or a plurality of magnetoresistive film strips on a highly-conductive thin-film conductor strip disposed perpendicular to the longitudinal direction of the magnetic-field-dependent resistor in an insulated manner. The highly-conductive thin-film conductor strip, however, is provided with a meandering structure. To create a resistance under current flow, in spite of the meandering strips of alternating magnetic field direction which are disposed adjacent to each other with the resistance changing equidirectionally in all subranges under the influence of a field that is to be measured, the magnetoresistive film strips are divided into regions having Barber pole structures with an angle of inclination that is opposite to the longitudinal direction of the strip. Advantageously, the meandering of the highly-conductive thin-film conductor strip results in the fact that only a little current is needed for the reversal of the direction of magnetization. Furthermore, the stray magnetic field existing outside of the sensor chip is very low because the magnetic fields of the meandering strips that are disposed adjacent to each other largely cancel each other because of their opposing direction. Thus, the magnetic field sensors can be operated in immediate proximity to each other. For that same reason, the remagnetization conductor also has a very low inductance, so that limitations of the measuring frequency due to the inductance no longer occur.

When the magnetic field sensor is operated with a magnetoresistive resistor, the latter is fed with a constant current. The voltage at the magnetoresistive resistor is measured as an output signal. Following a current pulse of a certain direction through the highly-conductive thin-film conductor strip, the self-magnetization in the areas of the magnetoresistive resistor is set in a certain manner. In this state, the magnetic field that is to be measured causes an increase of the resistance value of the magnetoresistive resistor. This means that the output signal is greater than in the case without a magnetic field. If a current pulse of opposite direction to the previous pulse is now fed into the highly-conductive thin-film conductor strip, the directions of the self-magnetizations are reversed. Thus, the field that is to be measured causes a reduction in the resistance, and the output voltage is smaller than in the case without a magnetic field. With a constantly changing pulse direction, an AC voltage whose amplitude is proportional to the magnetic field to be measured is thus present at the output. Any influences such as, for example, the temperature leading to a slow drift of the resistance value of the magnetoresistive film strip, do not influence the AC output voltage. But the decrease of the magnetoresistive effect is perceptible as the temperature in the output AC voltage amplitude increases.

Therefore, a further, highly-conductive film strip is provided under every magnetoresistive film strip in another embodiment of the invention. The current through these highly-conductive film strips is controlled by the sensor output voltage such that the applied magnetic field to be measured is just cancelled by the current. But the circuit necessary for this purpose is not the subject of this invention. In this case, the magnetoresistive magnetic field sensor acts as a zero detector. The output quantity of the arrangement is the quantity of the compensation current, which is not dependent on the temperature of the arrangement. Likewise, non-linearities no longer play a role in the sensor characteristic curve, because the sensor is not modulated.

In a further embodiment of the invention, a single magnetoresistive resistor is not used, but rather four parallel magnetoresistive resistors each comprising a plurality of regions are provided above the thin-layer remagnetization conductor and the highly-conductive compensation conductor; the regions are provided with Barber pole structures of an alternating positive and negative angle from the longitudinal direction of the magnetoresistive film strip such that they respectively begin with alternating regions of a positive and negative Barber pole structure angle. The four resistors are connected to form a Wheatstone bridge. If the remagnetization conductor is again operated with pulses of alternatingly opposite directions, an AC voltage signal appears at the bridge output. Only one direct voltage signal, which results from the possibly non-identical four resistance values of the bridge, is superposed over this signal. This direct voltage component is, however, significantly smaller than in the use of a single resistor, which permits simpler evaluation. Of course, the compensation of the magnetic field to be measured can also be employed here.

The bridge arrangement can comprise four resistors formed from an even number of regions. Only the sequence of the angle of the Barber pole structure changes from one resistor to the other. The remagnetization direction is set in the regions by a first, strong current pulse through the remagnetization conductor. The sensor bridge is thus magnetic field-sensitive, and can be used in a conventional manner without further remagnetization. Because all four resistors of the bridge comprise identical regions, identical changes are to be expected in all resistors when the temperature of the sensor arrangement is variable. This also applies for the change component that arises because of the variable layer voltages and, subsequently, because of the magnetostriction. The sensor bridge therefore has a reduced zero point compared to known sensor bridge arrangements, and is therefore also suited for measuring smaller fields in conventional operation. A constant current through the remagnetization conductor can serve to generate a certain stabilization magnetic field, via which a certain sensor sensitivity is set. The arrangement of the invention, therefore, can be used advantageously in the application of different evaluation methods for magnetic field measurement.

BRIEF DESCRIPTION OF THE DRAWINGS

The invention is described in detail below by way of embodiments.

DETAILED DESCRIPTION OF THE PREFERRED EMBODIMENTS

Figure 1:
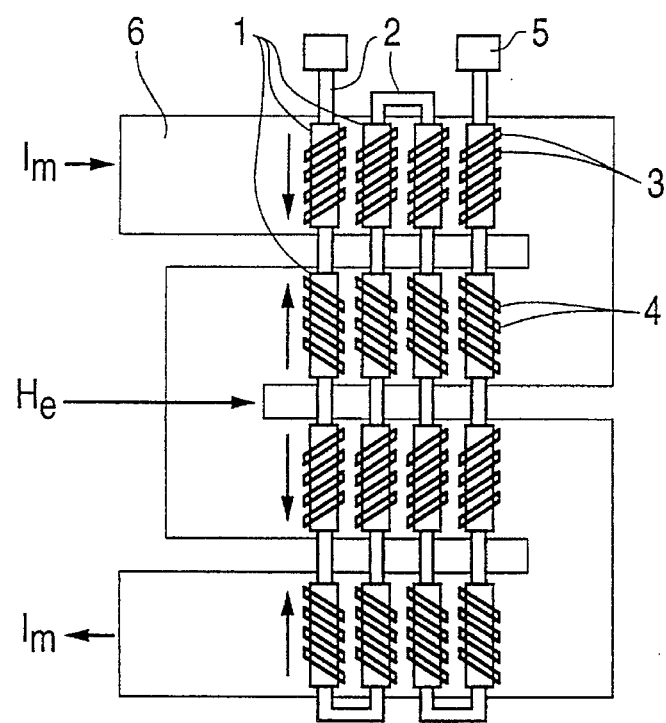
FIG. 1 shows a magnetoresistive resistor above a planar remagnetization conductor.
Figure 2:
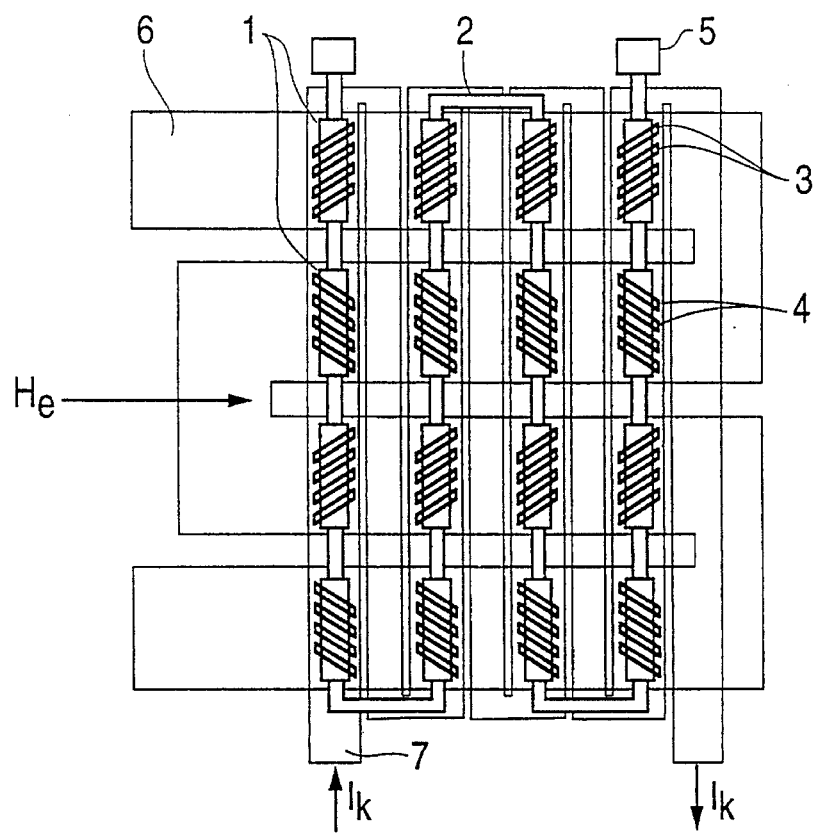
FIG. 2 shows how a planar compensation conductor is additionally included in the arrangement.
Figure 3:
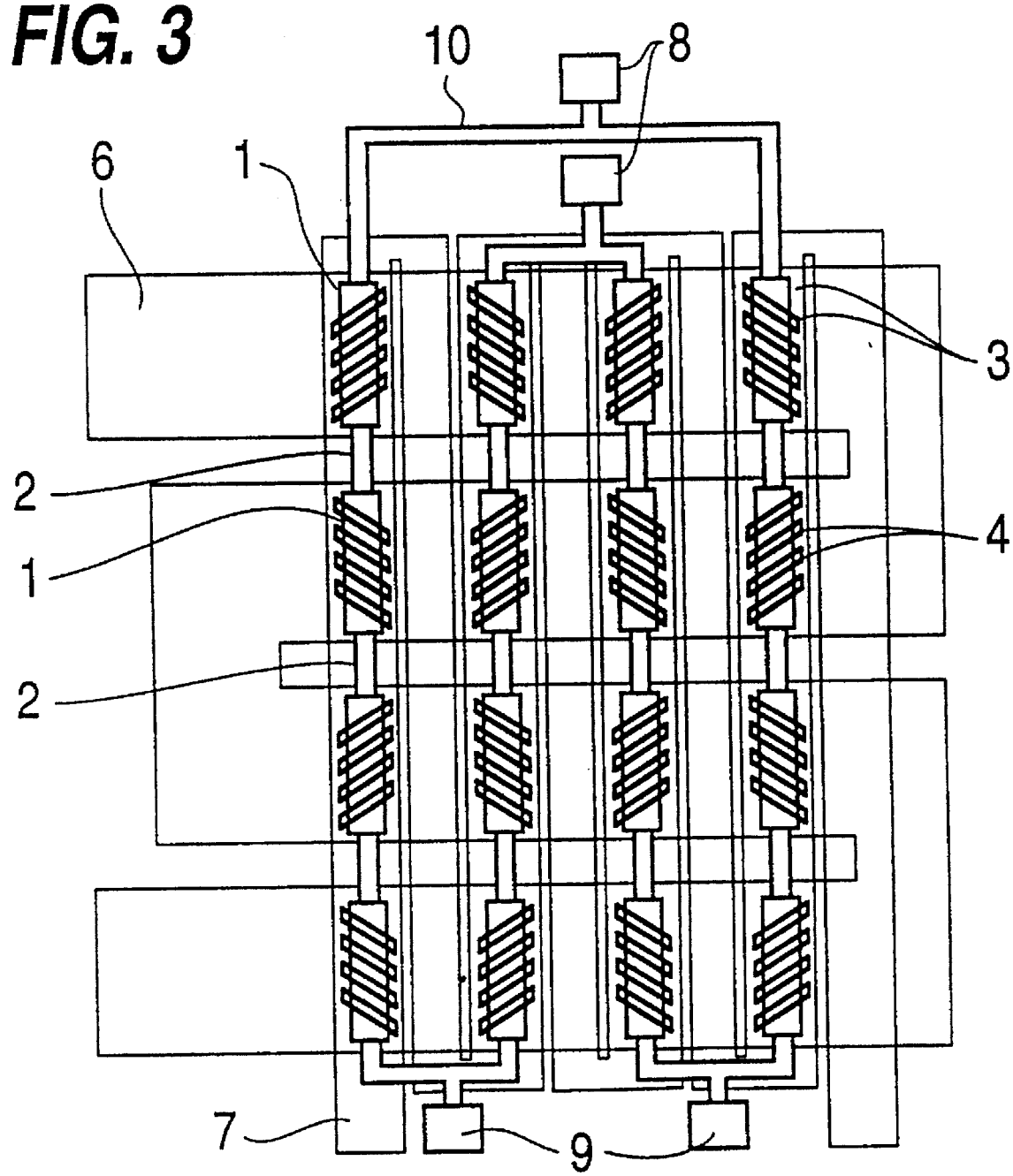
FIG. 3 shows a complex arrangement including a sensor bridge, remagnetization conductor and compensation conductor.

FIG. 1 illustrates a meandered, highly-conductive, planar thin-film conductor 6 located on a film substrate and into which a current $I_M$ can be fed at the connection at both ends. As used herein, "meander" "meandered" and "meandering" mean winding back and forth and each is intended to define the shape, for example of conductor 6 having parallel segments with alternate adjacent ends connected to form a meander form as shown in FIGS. 1 to 3. Insulated regions of magnetoresistive film strips are disposed above this thin-film conductor 6, with their longitudinal axis perpendicular to the meander strips of the thin-film conductor 6. Barber pole structures that alternatingly form a negative angle 3 and a positive angle 4 with the longitudinal direction of the regions 1 of the magnetoresistive film strips are located on the regions 1. The regions 1 are all electrically connected in series by well-conducting, non-magnetic connections 2, so a single resistor is present. The series connection can be connected electrically to the contact surfaces 5. A constant current is fed in at the contact surface 5 during operation of the magnetic field sensor. Following a current pulse through the remagnetization conductor 6 in the direction characterized by the arrow, the remagnetization directions are set in the regions 1, as shown by the corresponding arrows. In the remagnetization directions shown, an external magnetic field $H_e$ to be measured causes an increase in the resistance value in all regions 1 compared to the field-free state. A current pulse in the opposite direction through the remagnetization conductor 6 rotates the magnetizations of all regions 1 in the opposite direction. A drop in resistance is thus effected by the external magnetic field $H_e$. An AC voltage whose amplitude is proportional to the magnetic field intensity of $H_e$ can be tapped at the magnetoresistive resistor when periodic remagnetization occurs. A certain minimum field intensity is required to remagnetize the magnetoresistive regions. The field intensity generated by the remagnetization current is inversely proportional to the width of the thin-film conductor. Because of the meandering, the width is significantly reduced, and the current value required for remagnetization is therefore drastically reduced. A high resistance value can easily be realized because of the division of the magnetoresistive resistance conductor into many regions 1. Since the change in resistance is proportional to the resistance value, and this again becomes part of the output AC voltage as a proportionality factor, a high output voltage amplitude is also assured. The advantage of the magnetoresistive resistor likewise being configured in the form of a meander by the connections 2 is that the sensor element can be accommodated on chip surfaces of small dimensions.

The arrangement shown in FIG. 2 differs from the one in FIG. 1 solely in an additional, well-conducting film meander 7 disposed beneath the magnetoresistive regions 1. The magnetic field of the current $I_k$ through this meander 7 is in the opposite direction of the external magnetic field $H_e$ at the location of the regions 1. A signal which ensures that the current $I_k$ will be set exactly at such a value that the external magnetic field is canceled at the location of the regions 1 can be derived from the output AC voltage of the magnetoresistive resistor. The compensation current $I_k$ established in this way now represents the sensor output signal. The magnetoresistive resistor here acts only as a zero detector. Temperature dependencies and non-linearities in its characteristic curve are therefore eliminated.

In FIG. 3 the regions 1 of the magnetoresistive resistors are connected to each other by the connecting lines 2 and 10 such that a bridge circuit is formed. The contact surfaces 8 are provided for the bridge operation voltage; contact surfaces 9 are provided for the bridge output voltage. A remagnetization conductor 6 and a compensation line 7 are also present here, as in FIG. 2. Of course, compensation of the external magnetic field to be measured is also possible when the AC voltage signal of the bridge output is used to control the current $I_k$.

In FIG. 3, each bridge resistor comprises an even number of regions 1. The only difference is the angle of the Barber pole structures of the respectively adjacent regions 1. The bridge resistors are thus a combination of completely identical components. When temperature changes occur, the resistances will therefore also change by identical values. This also applies for the change in resistance via magnetostriction due to rotation of the magnetization direction. In magnetoresistive bridge arrangements known up to now, differences of this magnitude have represented the primary component of the zero drift of the bridge output voltage. Therefore, the proposed bridge also has a significantly reduced zero drift in operation with direct voltage. Thus, in an advantageous manner, operation of the bridge sensor is possible without continuous, periodic remagnetization of the regions 1. A direct current through the remagnetization conductor 6 can be used in this case to generate a constant magnetic field at the location of the regions 1, and to stabilize the magnetization direction established once in this manner.

We claim:

1. A magnetic field sensor, comprising:

a magnetoresistive resistor including at least one magnetoresistive film strip having a longitudinal direction and including a plurality of magnetically separated regions each having a longitudinal direction coinciding with the longitudinal direction of the film strip and being connected one behind the other in the longitudinal direction of the film strip, each said region having a Barber pole structure, the Barber pole structures of the respective regions forming alternatingly positive and negative angles with respect to the longitudinal direction of the film strip; and a remagnetization line including a highly-conductive thin-film conductor strip having a longitudinal direction forming an angle with the longitudinal direction of the magnetoresistive film strip, being insulated from the film strip, and being disposed in meander form beneath the film strip.

2. The magnetic field sensor according to claim 1, wherein the angle between the longitudinal direction of the magnetoresistive film strips and the highly-conductive thin-film conductor strip is 90°.

3. The magnetic field sensor according to claim 1, wherein the at least one magnetoresistive film strip comprises a plurality of magnetoresistive film strips which are parallel to one another and are connected in meandering form to form a single resistor.

4. The magnetic field sensor according to claim 1, wherein the at least one magnetoresistive film strip comprises two magnetoresistive film strips arranged parallel to one another, said sensor further comprising:

a conductor extending between the two magnetoresistive film strips resulting in a further meander; and additional highly-conductive thin-film conductor strips each having a longitudinal direction which coincides with the longitudinal direction of the respective magnetoresistive film strips, the additional highly-conductive thin-film conductor strips being insulated from the remagnetization line and the magnetoresistive film strips.

5. The magnetic field sensor according to claim 1, wherein said at least one magnetoresistive film strip comprises four parallel magnetoresistive film strips each having a plurality of regions having Barber pole structures alternating with positive and negative angles with respect to the longitudinal direction of the magnetoresistive film strip, the magnetoresistive film strips being connected to form a Wheatstone bridge.

6. The magnetic field sensor according to claim 5, wherein each resistor of the Wheatstone bridge comprises a plurality of magnetoresistive film strips.

\* \* \* \* \*